United States Patent
Frenk

4,056,760
Nov. 1, 1977

[54] METHOD OF DRIVING A TWO COORDINATE OSCILLATOR AND CIRCUIT ARRANGEMENT THEREFOR

[75] Inventor: Helmuth Frenk, Wetzlar, Germany

[73] Assignee: Ernst Leitz G.m.b.H., Wetzlar, Germany

[21] Appl. No.: 701,700

[22] Filed: July 1, 1976

Related U.S. Application Data

[63] Continuation-in-part of Ser. No. 443,241, Feb. 19, 1974, abandoned.

[30] Foreign Application Priority Data

Feb. 19, 1973    Germany .............................. 2308024

[51] Int. Cl.² .............................................. H02H 7/00
[52] U.S. Cl. ...................................... 318/115; 310/82; 310/25; 350/6; 318/37; 318/34
[58] Field of Search ......................... 318/115, 119–132, 318/695, 576, 577, 37, 38, 39, 35, 36; 350/6; 346/29; 310/25, 82, 15

[56] References Cited

U.S. PATENT DOCUMENTS

| | | | |
|---|---|---|---|
| 2,437,904 | 3/1948 | Adams et al. | 318/115 |
| 2,936,207 | 5/1960 | Beaumont et al. | 346/29 |
| 3,002,391 | 10/1961 | Holmes | 310/254 |
| 3,182,399 | 5/1965 | Price | 346/29 X |
| 3,386,786 | 6/1968 | Kaisler et al. | 350/6 |
| 3,544,221 | 12/1970 | Putnam | 350/6 X |
| 3,576,359 | 4/1971 | Cosh | 318/38 |
| 3,609,422 | 9/1971 | Nardin | 310/82 |
| 3,935,486 | 1/1976 | Nagashima | 318/38 |
| 4,001,658 | 1/1977 | Frenk | 318/37 |
| 4,011,003 | 3/1977 | Dragt | 350/6 |

FOREIGN PATENT DOCUMENTS 1,213,141    3/1966    Germany.

*Primary Examiner*—Donovan F. Duggan
*Attorney, Agent, or Firm*—Gilbert L. Wells

[57] ABSTRACT

A method and a circuit arrangement for driving a two co-ordinate mechanical oscillator with the aid of a deformed rotating field of forces defined by a plurality of exciting and pick-up components. The power dissipation of the employed circuits is kept at a low level by operating the oscillator near the mechanical resonance frequency. The exciting signals are achieved by comparing phase shifted electrical signals derived from the mechanical motion of the oscillator in a first pick-up component with the undisplaced signals of the second directional component and by supplying the difference signal obtained therefrom to the second exciting components of the oscillator. This is continued to the next adjacent components until the ring is closed.

7 Claims, 2 Drawing Figures

METHOD OF DRIVING A TWO COORDINATE OSCILLATOR AND CIRCUIT ARRANGEMENT THEREFOR

CROSS REFERENCES TO RELATED APPLICATIONS

The present invention is a Continuation-In-Part of Application Ser. No. 443,241, filed Feb. 19, 1974, now abandoned.

Applicant claims priority under 35 U.S.C. 119 for Application P 23 08 024.2, filed Feb. 19, 1973 in the Patent Office of the Federal Republic of Germany.

BACKGROUND OF THE INVENTION

The present invention relates to a method of and a circuit arrangement for driving a mechanical two coordinate oscillator with the aid of a deformed rotating field of forces defined by a plurality of exciting and pick-up components.

From the German Patent Specification No. 1,213,141 it is known that tumbler mirrors consist of a mirror mounted obliquely to a rotating shaft. They are used in the optical measuring technology for the production of an oscillation in two coordinate directions. Such arrangements, apart from the fact that the rotating parts are subject to certain wear and tear, also are subject to a bearing play leading to angle errors, which latter appear with double their value in the reflected beam. It is further known to set a system capable of oscillating in two mutually perpendicular coordinates into oscillation by causing the system to be excited into self-resonance in respect of one coordinate. Further signals, which correspond according to amplitude and phase to the nominal signals of the other directional components and which combine together to define a circular oscillation, are derived from this self-oscillation by phase shifting and potential dividing. The maintenance of an amplitude of the self-oscillation fed in as proportional nominal value voltage is supervised by additional regulating devices and, by comparison of the derived nominal signals with the measured actual values of the other directional components, control signals are obtained, by which the system is excited in respect to these exciting and pick-up components to forced oscillation at the frequency of the one self-oscillation.

This "master-slave" circuit has the disadvantage that in case of somewhat larger deviations of the natural frequency of the individual direction components from the natural frequency of the "master" oscillator, the power dissipation of the forced oscillation becomes disproportionally much greater than that of the self-oscillation. This has a particularly disadvantageous effect when the oscillator must take its drive energy from solar cells or batteries.

SUMMARY OF THE INVENTION

According to the present invention these disadvantages are overcome by providing a method of driving a two coordinate mechanical oscillator with the aid of a deformed rotating field of force defined by a plurality of exciting and pick-up components, the method comprising the steps of deriving a plurality of first electrical signals each corresponding to the mechanical motion of the oscillator in a respective one of the component directions, imparting to each first signal a phase shift equal to the geometrical angle between cyclically preceding ones of the exciting and pick-up components, and comparing in the cyclical sequence given by the deformed rotating field each undisplaced first signal adjacent to the exciting and pick-up components corresponding to the respective first signal with the phase displaced signal corresponding to one of the two exciting and pick-up components, deriving a respective difference signal from each comparison, and applying each difference signal to respective drive means of the mechanical oscillator associated with the exciting and pick-up component corresponding to the respective first undisplaced signal.

According to the present invention, there is provided a circuit arrangement for driving a two coordinate mechanical oscillator with the aid of a deformed rotating field of forces defined by a plurality of exciting and pick-up components, the arrangement comprising a plurality of pick-up transducers each to provide a respective electrical signal representative of the elongation of the mechanical oscillator in a respective one of the component directions, a plurality of amplifiers each having input means connected to output means of a corresponding one of the pick-up transducers, a plurality of phase-shift networks each having input means connected to output means of a corresponding one of the amplifiers, a plurality of differential amplifiers each corresponding to a respective one of the pick-up transducers and each having input means connected to output means of a corresponding one of the amplifiers and second input means connected to output means of the phase shift network corresponding to the preceding pick-up component in the cyclical sequence given by the deformed rotating electrical field, and a plurality of exciting transducers each having input means connected to output means of a corresponding one of the differential amplifiers to apply mechanical drive in the direction of the corresponding one of the directional components to the mechanical oscillator.

According to a further aspect of the present invention, there is provided a circuit arrangement for driving a two-coordinate mechanical oscillator with the aid of a deformed rotating electrical field defined by a plurality of exciting and pick-up components, the arrangement comprising a plurality of pick-up transducers each to provide a respective electrical signal representative of the elongation of the mechanical oscillation in a respective one of the component directions, a plurality of amplifiers each having input means connected to output means of a corresponding one of the pick-up transducers, a plurality of phase-shift networks each having input means connected to output means of a corresponding one of the amplifiers, a plurality of potential dividers each connected to output means of a corresponding one of the amplifiers, a plurality of differential amplifiers each corresponding to a respective one of the pick-up transducers and each having first input means connected to an intermediate point on a corresponding one of the potential dividers and second input means connected to output means of the phase shift network corresponding to the preceding pick-up component in the cyclical sequence given by the rotating electrical field, and a plurality of exciting transducers each having input means connected to output means of a corresponding one of the differential amplifiers to apply mechanical drive in the direction of the corresponding exciting component to the mechanical oscillator.

The new method links the oscillations of all exciting and pick-up components cyclically one with the other so that the frequency of oscillation finally resulting is a mean value of all the natural frequencies. In a 2-component system the first system is set into forced oscillation no longer by its own actual signal but by the phase shifted actual signal of the second component and the second system by the phase shifted actual signal of the first component. Thus, the respective phase shifted actual signal is compared in each case in a differential amplifier with the actual signal, and the amplified difference signal is applied to the exciting means of the mechanical oscillator.

In the case of $n$ directional components, the signals are passed on cyclically. The drive amplifier corresponding to the first component compares the responsive actual signal with that of the preceding (last) component displaced in phase through a $(180°/n)$; the drive amplifier of the second component compares the actual signal with the actual signal of the first component displaced in phase through $(180°/n)$ etc. In general, for the n-th component the respective actual signal is compared with the actual signal of the ($n$-first) component displaced in phase through $(180°/n)$.

BRIEF DESCRIPTION OF THE DRAWING

An embodiment of the invention will now be more particularly described with reference to FIG. 1 of the accompanying drawing which shows a circuit arrangement for driving a mechanical oscillator in the case of a rotating electrical field having three directional components.

DESCRIPTION OF THE PREFERRED EMBODIMENT

Figure 1:
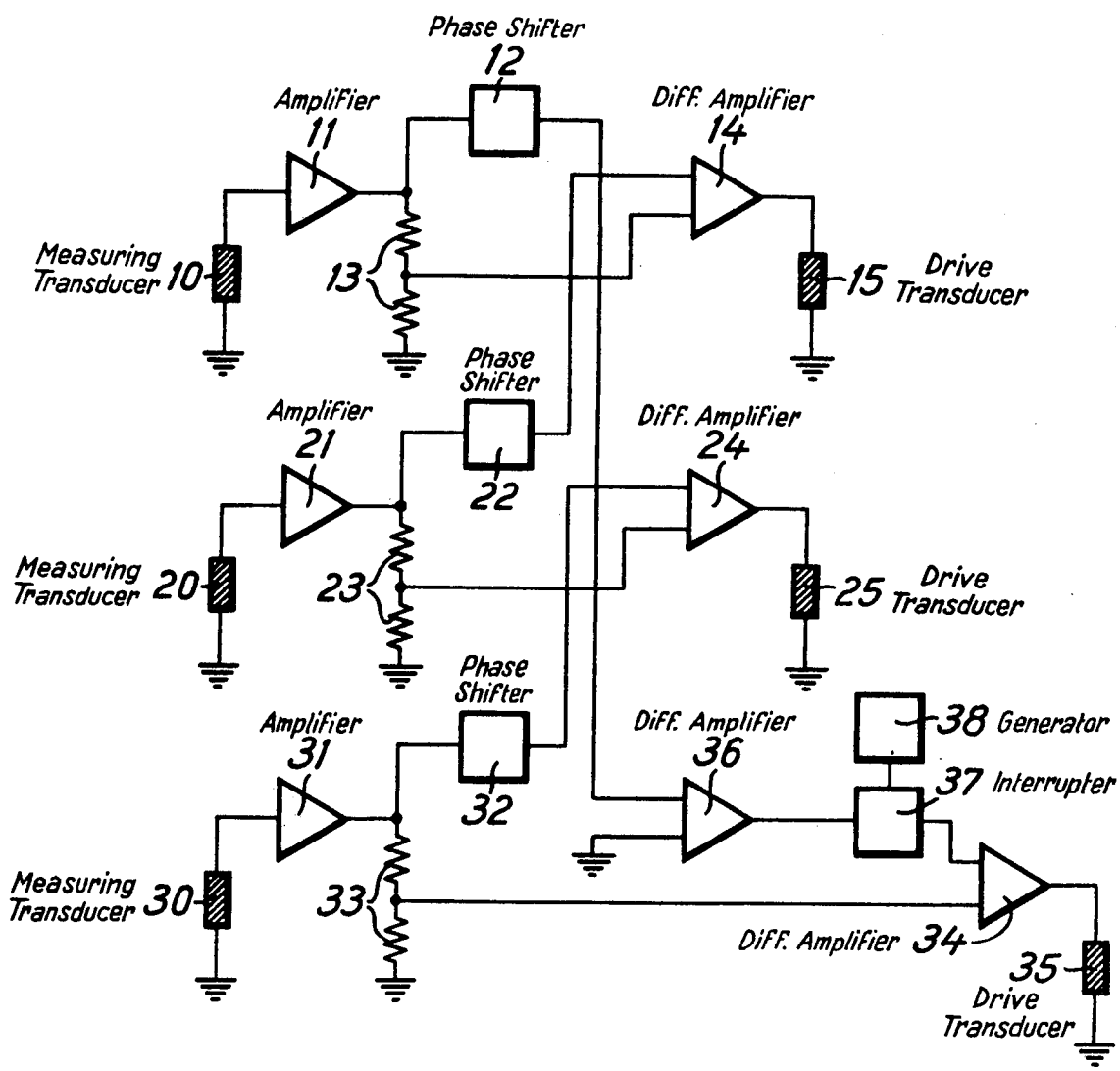

Referring now to the figure, the actual oscillation values of the three directional components are registered through mechanico-electrically operative first transducers 10, 20, 30. The electrical signals derived from the transducers 10, 20 and 30 are amplified in amplifiers 11, 21 and 31, respectively. The amplified actual signals are applied to respective phase shift networks 12, 22, 32 and to respective potential dividers 13, 23, 33 in each case connected in parallel with one another. In the case of three directional components, the phase is each time displaced through 60°. The potential dividers 13, 23 and 33 are each so adjusted that the signals at the output of the phase shifter and at the output of the associated potential divider have the same amplitude, so that a circular oscillation results.

Respective differential amplifiers in the form of operational amplifiers 14, 24 and 34 and respective electromechanical transducers 15, 25, 35 are allocated to each directional component. The actual signal derived from the pre-amplifier 11 is compared in the operational amplifier 14 with the actual signal derived from the pre-amplifier 21 and displaced in phase through 60° and, likewise, the actual signal derived from the pre-amplifier 21 is compared in the operational amplifier 24 with the actual signal derived from the pre-amplifier 31 and displaced in phase through 60°. The amplified difference signals are applied to drive means in the form of electro-mechanical transducers 15 and 25, respectively.

A further differential amplifier in the form of an operational amplifier 36, circuit interrupter means 37 and a direct voltage generator 38 form the rated amplitude regulator for the oscillator. The direct voltage generator 38 supplies a direct voltage, which is proportional to the rated amplitude and which is transformed into a rectangular voltage with the aid of the circuit interrupter means 37. This rated signal is compared in a differential amplifier in the form of an operational amplifier 34 with the actual signal derived from the pre-amplifier 31 and is applied amplified to the drive means 35. The "master slave" principle has thus here been retained in the manner, that the system 30 to 38 impresses its amplitude onto both other drive systems. To attain this, the coupling of the third directional component with the phase displaced actual signal of the first directional component occurs through the operational amplifier 36, which is operated in "open loop". It is thereby over-driven into rectangular oscillations in response to the amplitudes of the signal derived from the measuring means 10. These rectangular oscillations contain only the phase information of the measuring means 10. The amplitude information is added by the circuit interrupter means 37 in the rated value direct voltage generator 38. The one input of the amplifier 34 thus obtains a "rated value" which, according to amplitude and phase, is the same as that which the amplifiers 24 and 14 receive exclusively from the phase shifters 32 and 22.

By the comparison with the actual values of the respective oscillators, which are fed from the potential dividers 13, 23 and 33 to the inverting inputs of the amplifiers 14, 24, 34, these generate in correct phase position a drive voltage in the same phase, which is driving in the case of too small an amplitude and breaking in the case of too large an amplitude. On correct amplitude, but wrong phase of the respective oscillator, they generate a 90° component of the drive voltage so strong that the phase is corrected.

Apart from the mentioned electro-magnetic transducer systems, mechanico-electrical or electro-mechanical transducers, such as for example piezo-electric and capacitive transducers, may be utilized for the measuring means 10, 20, 30 and the drive means 15, 25, 35.

The described method and the illustrated circuit arrangement are not restricted to the generation of circular oscillations. By the predetermination of other amplitude and/or phase relationships, in the case of the compared actual values, elliptical oscillations or linear oscillations of variable inclination can for example also be generated.

Finally, the method can also be used for synchronizing mechanically separated individual oscillators in desired phase positions and amplitude displacements.

Figure 2:
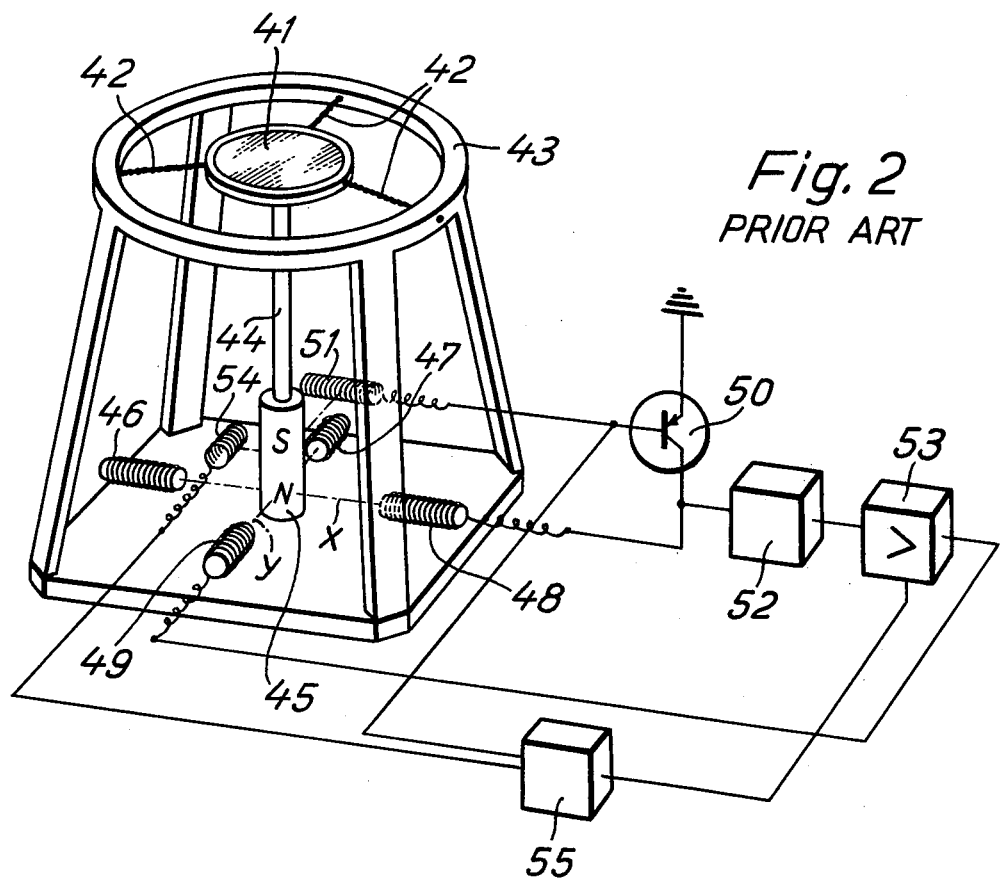
FIG. 2 is the prior art showing of the figure of German Pat. No. 1,213,141.

One embodiment of the invention of German Pat. No. 1,213,141 is illustrated in FIG. 2 and is described with reference to the schematic view thereof.

A plane mirror is suspended in a fixedly disposed ring 43 by way of three threads 42 arranged mutually offset by 120°. On the underside of the mirror, a strut 44 is attached carrying at its lower end a permanent magnet 45. The latter dips between the coils 46–49 of a rotary field; the coils 46, 48 of the field, associated with one component $x$, are fed by a transistor 50. The base of this transistor is connected to an auxiliary coil 51 excited by the movements of the magnet 45 in the mechanical natural frequency of the system. The supply voltage for the coils 47, 49 associated with the y-component, which are to be phase shifted by 90° with respect to the supply voltage of the other coils, is obtained from the output voltage of the transistor with the use of an integrator 52 with an amplifier 53 connected thereafter. Furthermore, a second auxiliary coil 54 is provided serving for the stabilization of the rotary field. The amplitudes of the voltage induced in this second coil by the movements of the magnet are compared with the amplitudes of the voltage of the first auxiliary coil in a stage 55, and the result of this comparison is utilized for controlling the amplifier 53. This ensures that the magnet describes exactly a circle within the rotary field, and thus the mirror is guided in exactly the desired configuration.

I claim:

1. A method of driving a two coordinate mechanical oscillator with the aid of a deformed rotating field of forces defined by a plurality of exciting and pick-up components, the method comprising the steps of:
   a. deriving a plurality of first electrical signals each corresponding to the mechanical motion of the oscillator in a respective one of the component directions;
   b. imparting to each first signal a phase shift equal to the geometrical angle between cyclically preceding ones of the pick-up components;
   c. comparing in the cyclical sequence given by each undisplaced first signal the deformed rotating field of forces adjacent to the exciting and pick-up components corresponding to the respective first signal with the phase displaced signal corresponding to the preceding pick-up component next adjacent;
   d. deriving a respective difference signal from each comparison; and
   e. applying each difference signal to respective exciting means of the mechanical oscillator associated with the component corresponding to the respective first undisplaced signal.

2. A circuit arrangement for driving a two coordinate mechanical oscillator with the aid of a deformed rotating field of forces defined by a plurality of exciting and pick-up components, the arrangement comprising:
   a. a plurality of pick-up transducers each to provide a respective electrical signal representative of the elongation of the mechanical oscillation in a respective one of the component directions;
   b. a plurality of amplifiers each having input means connected to output means of a corresponding one of the pick-up transducers;
   c. a plurality of phase shift networks each having input means connected to output means of a corresponding one of the amplifiers;
   d. a plurality of differential amplifiers each corresponding to a respective one of the pick-up transducers and each having first input means connected to output means of a corresponding one of the amplifiers and second input means connected to output means of the phase shift network corresponding to the preceding pick-up component in the cyclical sequence given by the deformed rotating electrical field; and
   e. a plurality of exciting transducers each having input means connected to output means of a corresponding one of the differential amplifiers to apply mechanical drive in the direction of the corresponding component of the mechanical oscillator.

3. A circuit arrangement for driving a two coordinate mechanical oscillator with the aid of a deformed rotating field of forces defined by a plurality of exciting and pick-up components, the arrangement comprising:
   a. a plurality of pick-up transducers each to provide a respective electrical signal representative of the elongation of the mechanical oscillation in a respective one of the component directions;
   b. a plurality of amplifiers each having input means connected to output means of a corresponding one of the pick-up transducers;
   c. a plurality of phase shift networks each having input means connected to output means of a corresponding one of the amplifiers;
   d. a plurality of potential dividers each connected to output means of a corresponding one of the amplifiers;
   e. a plurality of differential amplifiers each corresponding to a respective one of the pick-up transducers and each having first input means connected to an intermediate point on a corresponding one of the potential dividers and second input means connected to output means of the phase shift network corresponding to the pick-up component in the cyclical sequence given by the deformed rotating electrical field; and
   f. a plurality of exciting transducers each having input means connected to output means of a corresponding one of the differential amplifiers to apply mechanical drive in the direction of the corresponding component of the mechanical oscillator.

4. A circuit arrangement as claimed in claim 2, wherein the plurality of exciting and pick-up components comprise "$n$" equi-angularly spaced exciting and pick-up components, where $n$ is any positive integer greater than one, and wherein each phase shift network is arranged to impart a phase shift equal to ($180°/n$) to the electrical signal derived from the corresponding one of the first mentioned amplifiers.

5. A circuit arrangement as claimed in claim 2, wherein a rated amplitude regulator is connected between the output means of one of the phase shift networks and the first input means of the respectively associated differential amplifier.

6. A circuit arrangement as claimed in claim 5, wherein the amplitude regulator comprises a further differential amplifier having first input means connected to the output means of the one phase shift network and second input means connected to a source of fixed reference potential, circuit interrupter means having signal input means connected to the output means of the further differential amplifier, control input means connected to a direct voltage generator and signal output means connected to the first input means of the associated differential amplifier.

7. A circuit arrangement as claimed in claim 2, wherein each differential amplifier comprises an operational amplifier.

* * * * *